United States Patent [19]

Nishikawa et al.

[11] 4,441,974
[45] Apr. 10, 1984

[54] MAGNETRON SPUTTERING APPARATUS

[75] Inventors: Reiji Nishikawa; Shozo Satoyama, both of Yokohama; Yoshinori Ito, Chigasaki; Hidetaka Jyo, Sagamihara, all of Japan

[73] Assignees: Tokyo Shibaura Denki Kabushiki Kaisha, Kawasaki; Tokuda Seisakusho, Ltd., Zama, both of Japan

[21] Appl. No.: 489,593

[22] Filed: Apr. 28, 1983

[30] Foreign Application Priority Data

Apr. 30, 1982 [JP] Japan .................................. 57-71556

[51] Int. Cl.³ ............................................. C23C 15/00
[52] U.S. Cl. .................................. 204/192 R; 204/298
[58] Field of Search ............................. 204/298, 192 R

[56] References Cited

U.S. PATENT DOCUMENTS

| 4,116,793 | 1/1978 | Penfold et al. | 204/298 |
|---|---|---|---|
| 4,132,612 | 1/1979 | Penfold et al. | 204/298 |
| 4,162,954 | 7/1979 | Morrison | 204/192 R |
| 4,169,031 | 10/1979 | Brors | 204/298 |
| 4,180,450 | 12/1979 | Morrison | 204/192 N |
| 4,198,283 | 4/1980 | Class et al. | 204/298 |
| 4,239,611 | 12/1980 | Morrison | 204/192 R |
| 4,265,729 | 5/1981 | Morrison | 204/192 R |
| 4,309,266 | 1/1982 | Nakamura et al. | 204/298 |
| 4,312,731 | 1/1982 | Morrison | 204/298 |
| 4,361,472 | 11/1982 | Morrison | 204/298 |

FOREIGN PATENT DOCUMENTS

| 50-23382 | 3/1975 | Japan | 204/298 |
|---|---|---|---|
| 55-107776 | 8/1980 | Japan | 204/298 |
| 2078787 | 1/1982 | United Kingdom | 204/298 |
| 2028377 | 2/1982 | United Kingdom | 204/298 |

OTHER PUBLICATIONS

Hata et al., Conference Proceedings of the 15th Electrical/Electronics Insulation Conf., Chicago, Ill., U.S.A., Oct. 19-22, 1981, pp. 314-317.
Chapin, John S., "The Planar Magnetron", Research-/Development, Jan. (1974), pp. 37-40.
Tomie et al., "Digests of the Annual Conference of the Institute of Engineers and Communication Engineers of Japan", S-57, I-152.
Patent Abstracts of Japan, Unexamined Applications, C Field, vol. 6, No. 11, Jan. 22, 1983, The Patent Office Japanese Government, p. 28 C 88, Kokai-No. 56-133 460, (Tokyo Shibaura Denki K.K.).
Patent Abstracts of Japan, Unexamined Applications, C Field, vol. 5, No. 180, Nov. 19, 1981, The Patent Office Japanese Government, p. 126 C 79, Kokai-No. 56-105 474, (Matsushita Denki Sangyo K.K.).
Patent Abstracts of Japan, Unexamined Applications, C Field, vol. 5, No. 20, Feb. 6, 1981, The Patent Office Japanese Government, p. 158 C 42, Kokai-No. 55-148 769, (Tokyo Shibaura Denki K.K.).
IBM Technical Disclosure Bulletin, vol. 24, No. 7B, Dec. 1981, pp. 3632-3635, especially p. 3633.

Primary Examiner—Arthur P. Demers
Attorney, Agent, or Firm—Schwartz, Jeffery, Schwaab, Mack, Blumenthal & Koch

[57] ABSTRACT

There is disclosed a magnetron sputtering apparatus including a sputtering chamber, a substrate and target disposed within the sputtering chamber to form a desired space therebetween, device for applying a voltage between the substrate and target, and device for producing a magnetic field; and the apparatus comprises the magnetic field-producing device adapted to excite a magnetic field so that the direction of the magnetic field may be inverted on the magnetic symmetry axis within the space.

The magnetron sputtering apparatus of the present invention can form metal films having no crack without heating of the substrate and also form a magnetic recording film layer having an increased coercive force perpendicular to the surface of the film.

16 Claims, 16 Drawing Figures

MAGNETRON SPUTTERING APPARATUS

BACKGROUND OF THE INVENTION

The present invention relates to a magnetron sputtering apparatus, more particularly, to a magnetron sputtering apparatus capable of improving the magnetic field on the surface of a target to form a metal film without any deffect such as crack or the like.

As a method for forming a useful metal film on the surface of various substrates, there have been broadly employed methods such as vacuum depositing, plating, sputtering or others.

Among these, the vacuum depositing has the disadvantage that it is difficult to control the composition of a film made of a multi-component alloy which contains elements different from one another in vapor pressure. Plating causes a problem with respect to environmental pollution which may take place in treating the waste liquor. Therefore, attention has been directed to sputtering. For example, for the preparation of vertical type magnetic recording media having magnetic recording films of cobalt (Co)-chromium (Cr) alloy, there have been manufactured currently on the sputtering rather than the vacuum depositing since there is a large difference in vapor pressure between Co and Cr.

In the prior art film forming apparatus which utilizes the sputtering process, there is normally used a planar diode sputtering apparatus of such a type that two electrodes are used one for each of the target and substrate to form an electric field. However, the prior art apparatus provides a formation of film at a reduced speed. In addition, the temperature of the substrate increases up to several hundreds of degrees centigrade. It becomes, therefore, difficult to form a sputter film on a substrate made of a polymer since the substrate itself is deformed by heat.

In order to overcome such a disadvantage in the prior art sputtering apparatus, a magnetron sputtering apparatus has been developed in which films can be formed more rapidly without any rise of temperature in substrates. The developed apparatus comprises electrodes and magnetic poles which are arranged such that the electric field intersects the magnetic field in a sputter chamber in so that they are perpendicular to each other, as shown in FIG. 1. In this figure, A is a magnet system while B is an exhaust system. In this magnetron sputtering apparatus, for instance, as shown in FIG. 13, the magnetic field on an imaginary perpendicular line passing to a target through or by the magnetic symmetry axis is entirely directed to either the target or substrate.

However, according to said apparatus, defects with respect to structure such as micro-crack, crack and others often happens on the surface of the formed films. Among these defects, the crack is serious in that it increases as films are increased in thickness and that cracks remarkably appear on films where substrates are made of a polymer subject to heat-deformation, such as acrylonitrile-butadiene-styrene resin. Cracks are undesirable, particularly, if films are formed for various purposes such as magnetic recording, decoration, resist, surface hardening and others. Cracks, for example, generated on the magnetic recording layer of a magnetic recording medium lead to troubles, that is, (1) reduction of recording signals; (2) frictional wear of the magnetic head according to sliding at a time of recording or playback; and (3) the reduced durability of the magnetic recording medium itself. In addition, where a vertical type magnetic recording medium is formed with a magnetic recording layer of ferromagnetic Co-Cr alloy film, etc. by the use of the prior art magnetron sputtering apparatus, a new and important problem is caused in that the coercive force perpendicular to the surface of the magnetic recording film is reduced to decrease the output on reproducing.

In order to overcome such a disadvantage, it is effective to increase the substrate in temperature even in a magnetron sputtering apparatus. Such a procedure, however, cannot be applied to polymers subject to heat-deformation as in the planar diode sputtering apparatus, and also does not provide a desired means for preventing any crack since the magnetron sputtering apparatus constructed according to this principle becomes more complicated.

SUMMARY OF THE INVENTION

The present invention overcomes the above-mentioned disadvantages in the prior art magnetron sputtering apparatus. An object of the present invention is to provide a magnetron sputtering apparatus which can form a metal film having no crack without heating of a substrate used therein and which can form a magnetic recording layer having an increased coercive force perpendicular to the surface of the film when it is used for formation of the film made of Co-Cr alloy.

The present invention provides a magnetron sputtering apparatus comprising a sputtering chamber; a substrate and target disposed within said sputtering chamber to form a desired space therebetween; means for applying a voltage between said substrate and target; and means for producing a magnetic field; said apparatus being characterised in that said magnetic field-producing means is adapted to excite a magnetic field so that the direction of the magnetic field may be inverted on the magnetic symmetry axis within said space.

BRIEF DESCRIPTION OF THE DRAWINGS

The other objects and advantages of the present invention will be apparent from reading the following detailed description in connection with the accompanying drawings in which:

FIG. 1 is a longitudinal section of another magnetic field-producing means constructed in accordance with the present invention;

DETAILED DESCRIPTION OF THE PREFERRED EMBODIMENTS

Figure 1:
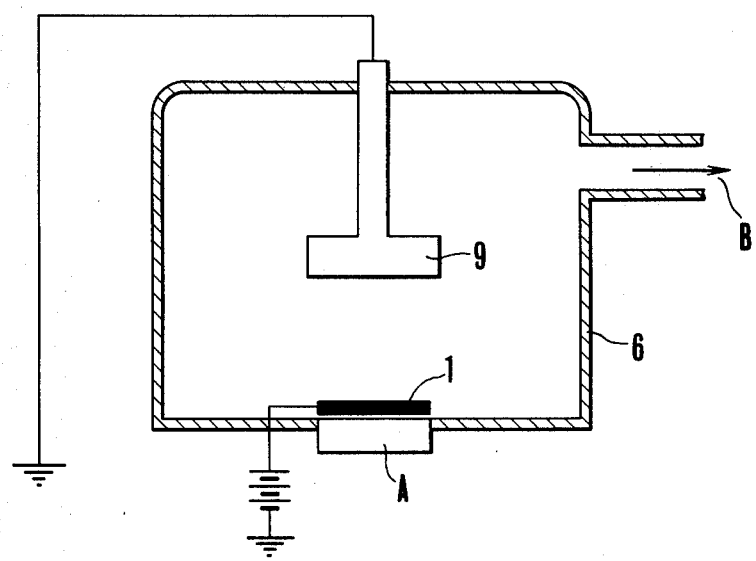
FIG. 1 is a schematic view of the prior art magnetron sputtering apparatus.

The magnetron sputtering apparatus according to the present invention comprises main components of a sputtering chamber, a target and substrate disposed within said chamber, a source of electric power for providing an electric field between the target and substrate, and means for producing a magnetic field. More particularly, an electric field is formed by a voltage which is applied between the target and the substrate, for example, by energizing a target electrode disposed on the back of the target and an electrode (substrate holder) disposed on the back of the substrate. Further, a magnetic field is formed between the target and substrate, for example, by a magnetic field-producing means located on the back of the target such that part of the magnetic field will intersect the above electric field at a right angle.

The magnetic field-producing means used in the present invention includes a permanent magnet, solenoid coil and the like which may be disposed to form the above-mentioned magnetic field. Alternatively, the magnetic field-producing means may include various combinations, that is, a combination of permanent magnets with a solenoid coil, a combination of permanent magnets with a yoke made of a ferromagnetic material being relatively soft in its magnetic property such as iron, etc., and a combination of permanent magnets with the yoke and solenoid coil. In these means, the combination of the permanent magnets with the yoke and the combination of the permanent magnets with the yoke and solenoid coil are preferred.

Some embodiments of magnetic field-producing means according to the present invention will now be described.

If it is desired to form the above-mentioned magnetic field only by the use of permanent magnets, one of the permanent magnets (A sectional area parallel to the target surface is referred to $S_1$. The permanent magnet will be abbreviated to magnet I for convenience sake.) is located on the central area of the back of a target with the south pole of the magnet facing the target. A plurality of additional magnets (The total sectional area parallel to the surface of the target is referred to $S_2$. The additional magnets will be abbreviated to magnets II for convenience sake.) having substantially the same function as the above magnet I are disposed on the back of the target along the peripheral edge thereof symmetrically about the magnet I with the north poles thereof facing the target. At this time, the sectional area $S_2$ should be larger than the sectional area $S_1$. Preferably, the ratio of $S_2$ to $S_1$ is three or more. Thus, the magnet I is magnetically saturated while the magnetic flux from the north poles of the magnets II penetrates in part into the south pole of the magnet I and directly returns in part to the south poles of the magnets II themselves. Accordingly, the magnetic field produced by the magnets I and II will be inverted in direction on the magnetic symmetry axis.

Figure 2:
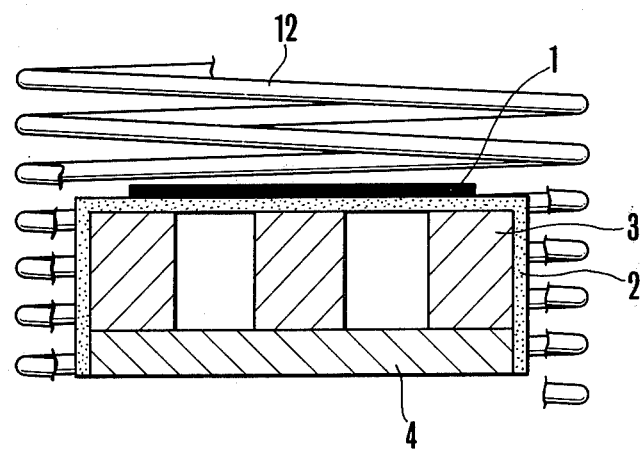
FIG. 2 is a diagrammatic side view of a magnetic field-producing means which consists of a permanent magnet and a solenoid coil in combination.
Figure 3:
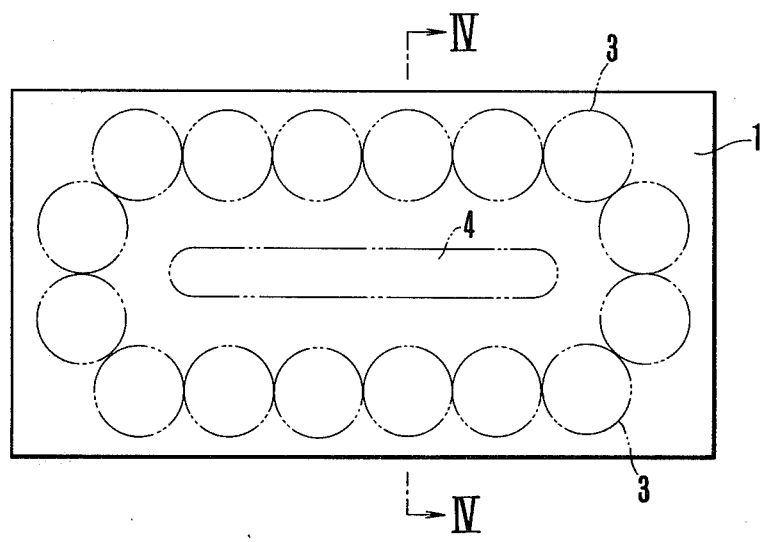
FIG. 3 is a diagrammatic plan view of a magnetic field-producing means according to the present invention.
Figure 4:
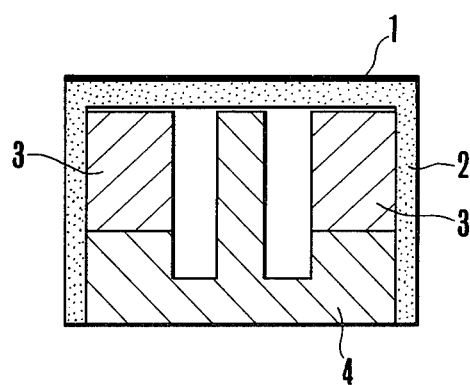
FIG. 4 is a longitudinal section view taken along a line IV—IV in FIG. 3.

Further, the magnetic poles in the magnets I and II may be reversed in direction. In such a case, the direction of the produced magnetic field will be oriented along an imaginary perpendicular line from the substrate to the target. However, the advantage of the present invention will not be adversely affected by such an orientation in the magnetic field only for such a reason why the electrons are reversed in the direction of magnetron motion.

Where permanent magnets and solenoid coils are together utilized, for instance, as shown in FIG. 2, permanent magnets are disposed on the back of the target 1 as in the arrangement in which only permanent magnets are used described hereinbefore in addition to an arrangement in which a target 1 and solenoid coil 12 are located. By using the solenoid coils, the distribution of the magnetic field can be controlled simply by changing the current passing through the solenoid coils.

Where permanent magnets are used in combination with a yoke, the permanent magnets are arranged in a manner similar to that in the aforementioned structure in which only the permanent magnets are used, except that the yoke is made of a ferromagnetic material being relatively soft in its magnetic property and located on the central area of the back of the target (see FIGS. 3 and 4). In consideration with the differential saturated magnetic flux between the yoke and permanent magnets and the magnetic property of the yoke, such a structure provides the desired magnetic field on the basis of the similar saturation magnetization phenomenon and the flow of flux created by the magnetic resistance in the yoke.

Further, even in such an arrangement that the magnet-yoke system shown in FIGS. 3 and 4 is combined with solenoid coils arranged as shown in FIG. 2, magnetic field-producing means capable of controlling the magnetic field can be provided.

The magnetron sputtering apparatus of the present invention may be used to form a plurality of magnetic fields with respect to the present invention in the same target.

Figure 9:
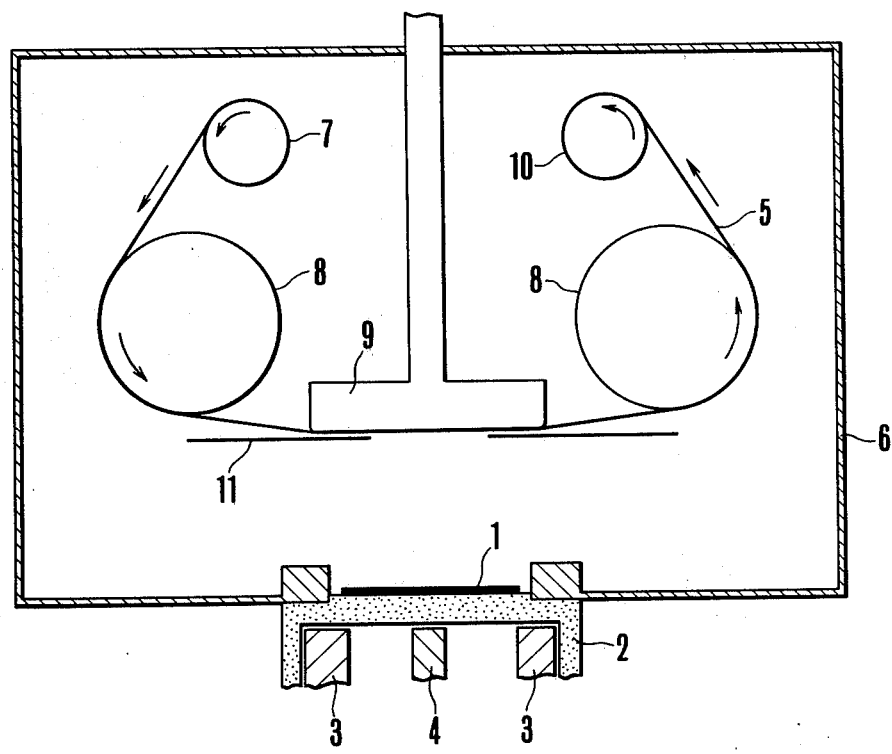
FIG. 9 is a schematic view of a film carrying system.

The magnetron sputtering apparatus including the aforementioned magnetic field-producing means can continuously operate sputtering by moving the substrate without interruption (FIG. 9).

Figure 10:
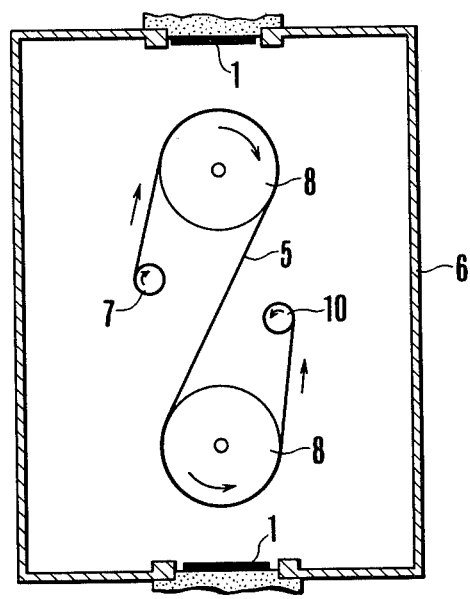
FIG. 10 is a schematic view showing another example of the film carrying system.

If such an apparatus as shown in FIG. 10 is used, the substrate can be sputtered at its opposite faces. In practice, the magnetron sputtering apparatus of FIG. 10 is preferably used to manufacture, for example, a floppy disc having magnetic recording media which are formed on its opposite faces.

By using the magnetron sputtering apparatus provided as described hereinbefore, a magnetic field may be improved in comparison with the prior art sputtering apparatuses. As a result, charged particles (for example, electrons) may properly be incident upon the substrate to increase only the surface of the substrate in temperature without any crack.

In accordance with the present invention, the magnetron sputtering apparatus can form metal films having no crack without heating of the substrate and also form a magnetic recording layer having an increased coercive force perpendicular to the surface of the film when applied it to the formation of the film made of Co-Cr alloy.

Some examples and comparative examples will be described hereinbelow.

EXAMPLE 1

Figure 6:
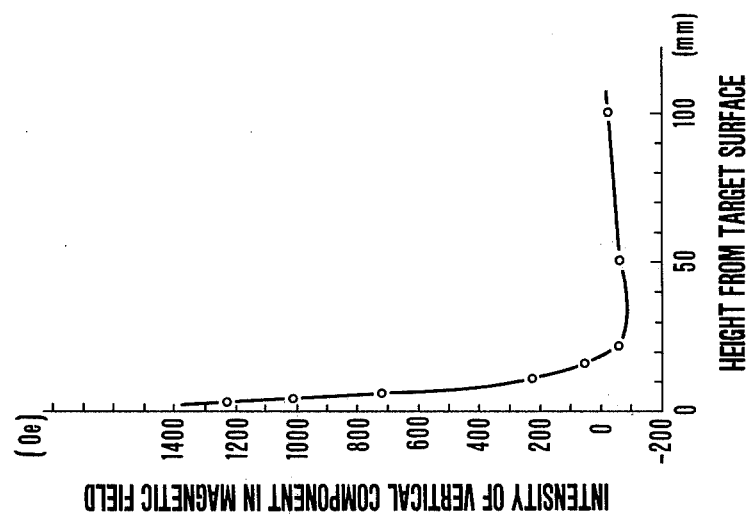
FIG. 6 is a view showing a curve with respect to the relationship between the height from the target surface and the intensity of vertical component in the magnetic field in Example 1.
Figure 5:
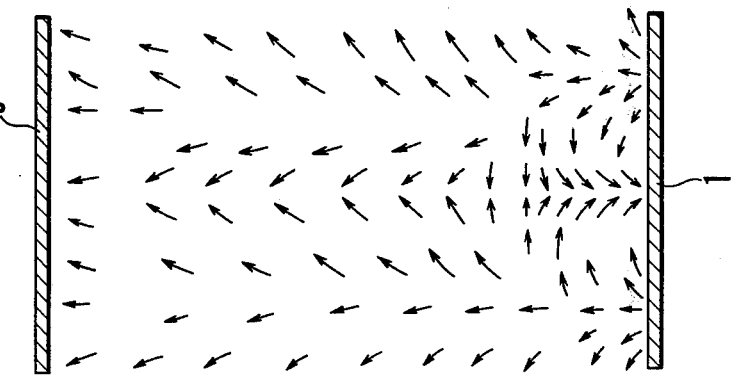
FIG. 5 is a diagrammatic view illustrating the direction of a magnetic field which is produced between a target and substrate in Example 1.

As shown in FIGS. 3 and 4, a target 1 of 60 mm×120 mm was located on the upper face of a copper electrode 2. Samarium-cobalt magnets 3 of 15.2 mm diameter and 20 mm height were disposed as shown by broken lines in FIG. 3 with the north poles thereof facing the underside of the target 1. Substantially E-shaped yoke 4 was disposed below the undersides of the magnets and also at the central area of the underside of the target electrode 2. The direction of the magnetic field produced in the space above the target 1 and the intensity of the vertical component in this magnetic field (oersted: Oe) are shown in FIGS. 5 and 6, respectively. FIG. 5 is a diagrammatic view in which the direction of the magnetic field between the target 1 and the substrate 5 is shown by arrows. FIG. 6 illustrates the intensity of vertical components in the magnetic field on an imaginary perpendicular line passing through or by the center of the magnetic circuit in the space above the target 1 toward the target 1. In FIG. 6, the vertical line represents the intensity as plus in the direction of the target while the horizontal line represents the height from the target surface (mm).

In the above-mentioned magnetron sputtering apparatus, the spacing between the target 1 and the substrate 5 was 100 mm, and the substrate was made of acrylonitrile-butadiene-styrene resin. The sputtering chamber 6 was filled with argon gas of $5 \times 10^{-3}$ Torr. Thereafter, films were formed at sputtering speeds of 600 Å/min. and 1000 Å/min. without heating.

The target 1 was made of three different materials, that is, chromium (Cr) with 1.0 mm thickness, cobalt (Co)- chromium (Cr) alloy with 2.0 mm thickness and its saturation magnetization of 450 gausses, and iron (Fe)- nickel (Ni) alloy with 2.0 (mm thickness and its saturation magnetization of) 620 gausses. By using the respective targets made of these materials, films of 1000 Å, 5000 Å and 5000 Å thickness were obtained, respectively.

With visual and microscopic observations, no crack could be found on all the films obtained. In any event, the Co-Cr alloy film was 1080 oersteds in its coercive forces perpendicular to the surface thereof.

EXAMPLE 2

Figure 7:
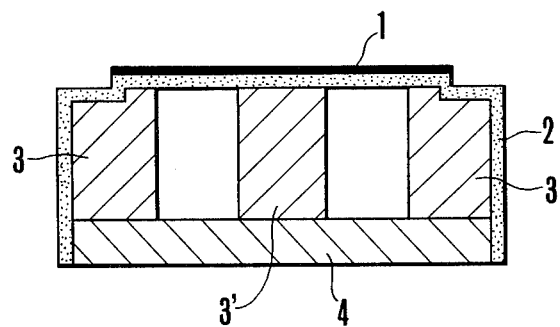
Figure 8:
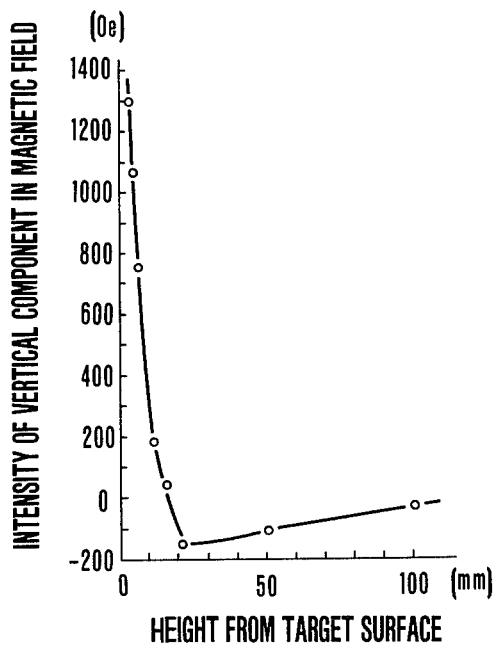
FIG. 8 is a view showing a curve with respect to the relationship between the height from the target surface and the intensity of vertical component in the magnetic field in Example 2.

As shown in FIG. 7, a target 1 of 60 mm diameter was used while a magnet 3' of 23.6 mm diameter slightly larger than that of the magnet in Example 1 was located with the south pole thereof facing the central area of the underside of a target electrode 2. Further, the same magnets 3 as in Example 1 were disposed about the target magnet 2 along the peripheral edge of the underside of the target electrode with the north poles thereof facing the underside of the target electrode. Films were made through the same procedure as in Example 1. Ratio of $S_2/S_1$ was approximately 5. The direction of magnetic field was substantially identical with that of FIG. 5. FIG. 8 shows a curve with respect to the relationship between the height from the surface of the target 1 and the intensity of vertical components in the magnetic field.

Three different targets 1 were made respectively of chromium with 1.0 mm thickness, Co-Cr alloy with 3.5 mm thickness and its saturation magnetization of 350 gauss, and Fe-Ni alloy with 2.5 mm thickness and its saturation magnetization of 620 gausses. Films obtained by using these targets had no crack. Co-Cr alloy film was 1120 oersteds in its coercive force perpendicular to the surface thereof.

EXAMPLE 3

The apparatus used in Example 1 was combined with a film carrying system shown in FIG. 9 in which the substrate 5 was moved in the direction shown by an arrow. Thus, there was provided a magnetron sputtering apparatus for continuously forming films.

The film carrying system included a supply roll 7 around which an elongated film-shaped substrate 5 is wound; guide rollers 8 for guiding the substrate 5 continuously fed to a sputtering station; a substrate holder 9 spaced from and opposed to a target 1 by a distance of 100 mm with the underside thereof slidably engaging with the moving substrate 5; a take-up roll 10 around which the treated substrate 5 is rolled; and a mask 11 spaced away from the substrate 5 by 0.5 mm to provide a sputtering region having its longitudinal dimension of 70 mm for the substrate 5.

In the above apparatus, the substrate 5 was Kapton film (trade name, available from DuPont de Nemours & Co. Inc.) of 25 μm thickness and ½ inches width while the target 1 was made of Co-Cr alloy with the dimensions of 60 mm×120 mm×2.0 mm and its saturation magnetization of 450 gausses. Films of 2400 Å thickness were formed as the substrate was moved at speeds of 0.93 cm/min. and 1.9 cm/min.

The resulting films had no crack. The coercive force perpendicular to the surface of film was 930 oersteds at the substrate moving speed of 0.93 cm/min. and 1050 oersteds at the subtrate moving speed of 1.9 cm/min.

EXAMPLE 4

A magnetron sputtering apparatus was composed of the apparatus used in Example 2 and the film carrying system used in Example 3.

The sputtering region had its dimension of 30 mm. The target 1 was made of Co-Cr alloy with a diameter of 60 mm and a thickness of 3.7 mm and with its saturation magnetization of 350 gausses. The substrate was moved at two speeds of 0.3 cm/min. and 0.4 cm/min. Films having a thickness of 2400 Å were formed through the same pocedure as in Example 3.

The resulting films had no crack. The coercive force perpendicular to the surface of film was 1350 oersteds at the substrate moving speed of 0.3 cm/min. and 1400 oersteds at 0.4 cm/min.

COMPARATIVE EXAMPLE 1

Figure 11:
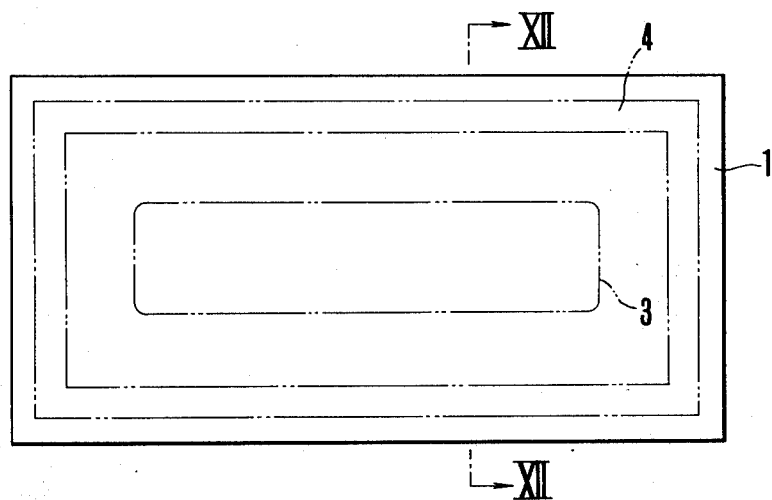
FIG. 11 is a diagrammatic plan view of the prior art magnetic field-producing means.
Figure 12:
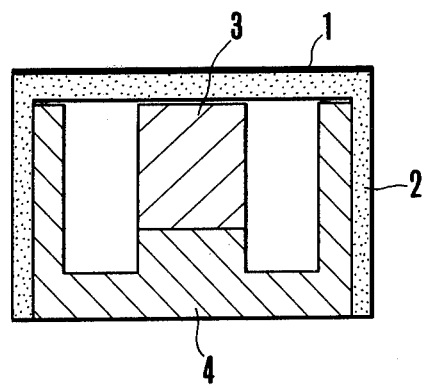
FIG. 12 is a longitudinal section taken along a line XII—XII in FIG. 11.
Figure 14:
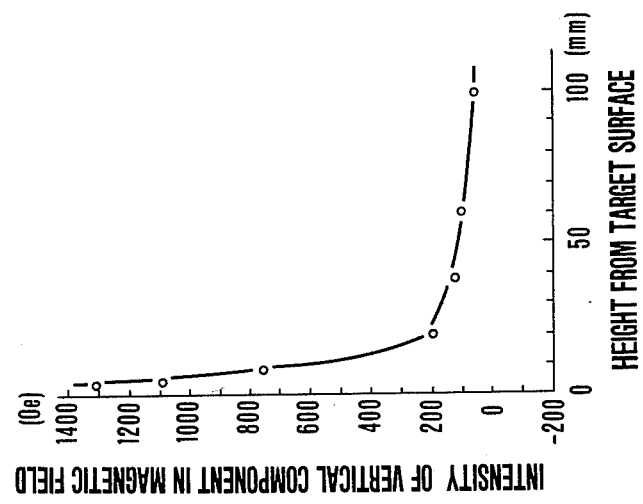
FIG. 14 is a view showing a curve with respect to the relationship between the height from the target surface and the intensity of vertical component in the magnetic field in Comparative example 1.
Figure 13:
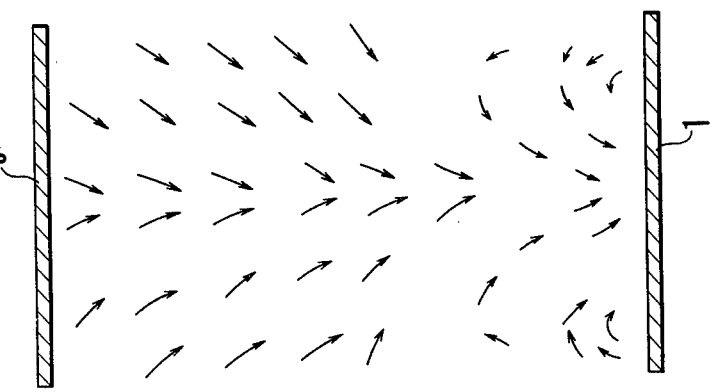
FIG. 13 is a diagrammatic view illustrating the direction of a magnetic field which is produced between a target and substrate in Comparative example 1.

As shown in FIGS. 11 and 12, samarium-cobalt magnet 3 having dimensions of 18 mm×78 mm×15.5 mm (height) was located below the central area of a copper target electrode 2 with the south pole of the magnet 3 facing the underside of the electrode 2. A yoke 4 of iron was disposed below the magnet with the peripheral upstanding portion of the yoke opposed to the peripheral undeside portion of the target electrode 2. Films were formed through the same procedure as in Example 1 without heating of the substrate. FIG. 13 shows the direction of the magnetic field produced in this example while FIG. 14 shows a curve representing the relationship between the height from the surface of the target 1 and the intensity of vertical components in the magnetic field.

The magnetic field was identical with that of the prior art sputtering appartus. The direction of magnetic field on an imaginary perpendicular line passing through or by the center of the magnetic circuit toward the target 1 was fully oriented to the target.

All the resulting films had remarkable cracks. The same results were obtained even if the spacing between the target and the substrate was selected both to be 50 mm and 150 mm. The coercive force perpendicular to the surface of the Co-Cr alloy film was 380 oersteds.

COMPARATIVE EXAMPLE 2

Figure 15:
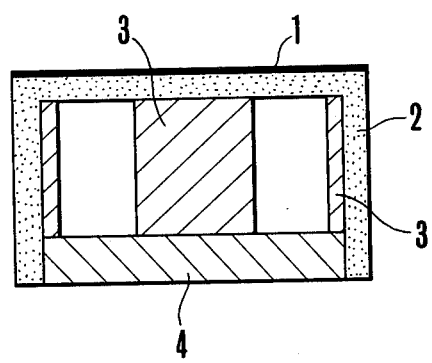
FIG. 15 is a longitudinal section of the other magnetic field-producing means in the prior art.
Figure 16:
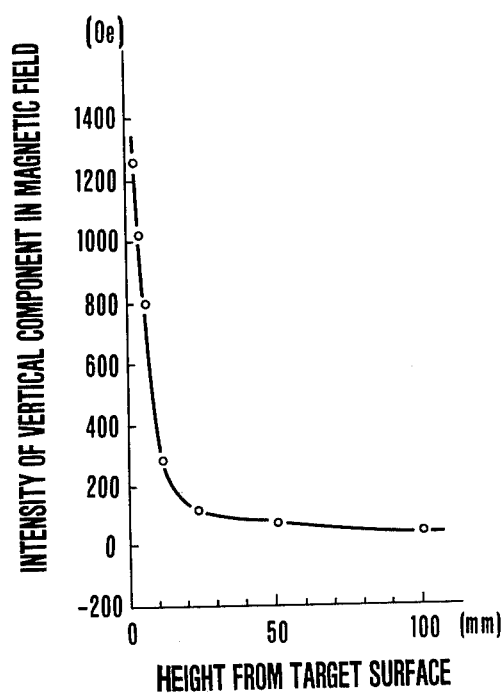
FIG. 16 is a view showing a curve with respect to the relationship between the height from the target surface and the intensity of vertical component in the magnetic field in Comparative example 2.

As shown in FIG. 15, a samarium-cobalt magnet 3 having a diameter of 20 mm and a height of 20 mm was located below a traget electrode 2 at the central underside thereof. A plurality of similar samarium-cobalt magnets 3 of 10 mm×20 mm×2.5 mm were disposed below the target electrode 2 along the peripheral underside thereof. Films were formed through the same procedure as in Example 2. A curve representing the relationship between the height from the surface of the target 1 and the intensity of vertical components in the magnetic field in this example is shown in FIG. 16. The direction of magnetic field in the space above the target 1 is omitted because it is substantially identical with that of Comparative example 1.

All the resulting films had remarklable cracks. The same results were obtained even if the spacing between the target and substrate was changed to 50 mm; the speed at whcih the films were formed to 300 Å/min.; the pressure of argon gas to $2.8 \times 10^{-3}$ Torr and $7 \times 10^{-3}$ Torr, respectively. The coercive force perpendicular to the surface of the Co-Cr alloy film was 400 oersteds.

COMPARATIVE EXAMPLE 3

By using a magnetron sputtering apparatus constituted of the apparatus used in Comparative example 1 and the film carrying system of Example 3 incorporated into the above apparatus, films were formed through the same procedure as in Example 3.

All the resulting films had remarkable cracks. The same results were obtained even though the spacing between the target and substrate was changed to 50 mm and 120 mm; and the pressure of argon gas to $3 \times 10^{-3}$ Torr and $6.5 \times 10^{-3}$ Torr, respectively. The coercive force perpendicular to the surface of the film was 420 oersteds at the substrate moving speed of 0.93 cm/min. and 380 oersteds at 1.9 cm/min.

COMPARATIVE EXAMPLE 4

A magnetron sputtering apparatus was obtained by incorporating the film carrying system of Example 3 into the apparatus of Comparative example 2. By using such an apparatus, films were obtained through the same procedure as in Example 4.

All the resulting films had remarkable cracks. The coercive force perpendicular to the film surface was 400 oersteds at both the substrate moving speeds of 0.3 cm/min. and 0.4 cm/min.

We claim:

1. A magnetron sputtering apparatus comprising a sputtering chamber; a substrate and target disposed within said sputtering chamber to form a desired space therebetween; means for applying a voltage between said substrate and target; and means for producing a magnetic field so that the direction of the magnetic field is inverted on the magnetic symmetry axis within said space.

2. A magnetron sputtering apparatus according to claim 1, wherein said magnetic field-producing means includes a combination of permanent magnets which are located on the back of said target.

3. A magnetron sputtering apparatus according to claim 1, wherein said magnetic field-producing means includes a combination of permanent magnets on the back of said target with a yoke.

4. A magnetron sputtering apparatus according to claim 3, wherein said yoke includes a central protrusion extending toward the back of said target, said permanent magnets being disposed around said central protrusion of said yoke with one pole in each of said permanent magnets being faced to the back of said target.

5. A magnetron sputtering apparatus according to claim 2, wherein solenoid coils are disposed around said permanent magnets for producing another magnetic field intersecting said magnetic field produced by said permanent magnets at right angle.

6. A magnetron sputtering apparatus according to claim 1, further including means for continuously carrying a flexible substrate.

7. A magnetron sputtering apparatus according to claim 1, further including means for sputtering said substrate at the opposite faces thereof at the same time.

8. A magnetron sputtering apparatus according to claim 1, wherein said target is made of a material containing chief components of Co and Cr.

9. A magnetron sputtering apparatus comprising:
a sputtering chamber;
a substrate and target disposed within said sputtering chamber to form a desired space therebetween;
means for applying a voltage between said substrate and target, and
means for producing a magnetic field; said apparatus being characterized in that said magnetic field-producing means is adapted to excite a magnetic field so that the direction of the magnetic field may be inverted on the magnetic symmetry axis within said space; said magnetic-field producing means includes a combination of permanent magnets which are located on the back of said target; said combination of permanent magnets includes a first permanent magnet having the south or north pole thereof faced to said target and a plurality of second permanent magnets having substantially the same magnetic property as that of said first permanent magnet, said second permanent magnets being disposed around said first permanent magnet and positioned with the magnet pole opposite to that of said first permanent magnet being faced to said target.

10. A magnetron sputtering apparatus according to claim 9, wherein a ratio of the total sectional area $S_2$ of said second magnets parallel to said target to the sectional area $S_1$ of said first magnet parallel to said target $(S_2/S_1)$ is three or more.

11. A magnetron sputtering apparatus according to claim 9, wherein said magnetic field-producing means includes a combination of permanent magnets on the back of said target with a yoke.

12. A magnetron sputtering apparatus according to claim 11, wherein said yoke includes a central protrusion extending toward the back of said target, said permanent magnets being disposed around said central protrusion of said yoke with one pole in each of said permanent magnets being faced to the back of said target.

13. A magnetrong sputtering apparatus according to claim 9, wherein solenoid coils are disposed around said permanent magnets for producing another magnetic field intersecting said magnetic field produced by said permanent magnets at right angle.

14. A magnetron sputtering apparatus according to claim 12, wherein solenoid coils are disposed around said permanent magnets for producing another magnetic field intersecting said magnetic field produced by said permanent magnets at right angle.

15. A magnetron sputtering apparatus according to claim 1, wherein said apparatus is used for a preparation of vertical type magnetic recording media.

16. A method for forming a magnetic thin film on the surface of a substrate by magnetron sputtering, said method comprising the steps of:
disposing the substrate and target within a sputtering chamber to form a desired space therebetween;
supplying a voltage between said substrate and target; and forming a magnetic field so that the direction of the magnetic field is inverted on the magnetic symmetry axis within said space.

* * * * *